(12) United States Patent
Yang et al.

(10) Patent No.: US 11,094,697 B2
(45) Date of Patent: Aug. 17, 2021

(54) VERTICAL TWO-TRANSISTOR SINGLE CAPACITOR MEMORY CELLS AND MEMORY ARRAYS

(71) Applicant: Micron Technology, Inc., Boise, ID (US)

(72) Inventors: Gloria Yang, Boise, ID (US); Suraj J. Mathew, Boise, ID (US); Raghunath Singanamalla, Boise, ID (US); Vinay Nair, Boise, ID (US); Scott J. Derner, Boise, ID (US); Michael Amiel Shore, Boise, ID (US); Brent Keeth, Boise, ID (US); Fatma Arzum Simsek-Ege, Boise, ID (US); Diem Thy N. Tran, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,468

(22) Filed: Nov. 7, 2018

(65) Prior Publication Data

US 2019/0088652 A1 Mar. 21, 2019

Related U.S. Application Data

(62) Division of application No. 15/664,161, filed on Jul. 31, 2017, now Pat. No. 10,157,926.

(Continued)

(51) Int. Cl.
*H01L 27/108* (2006.01)
*G11C 11/403* (2006.01)
(Continued)

(52) U.S. Cl.
CPC .......... *H01L 27/108* (2013.01); *G11C 11/403* (2013.01); *H01L 28/90* (2013.01);
(Continued)

(58) Field of Classification Search
CPC ... H01L 27/108; H01L 27/0688; H01L 28/90; H01L 29/7827; H01L 29/42376;
(Continued)

(56) References Cited

U.S. PATENT DOCUMENTS 4,103,342 A 7/1978 Miersch et al.
4,554,570 A 11/1985 Jastrzebski
(Continued)

FOREIGN PATENT DOCUMENTS

EP 0706187 4/1996
EP 2296176 3/2011
(Continued)

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.
(Continued)

*Primary Examiner* — Thao X Le
*Assistant Examiner* — Gardner W. S. Swan
(74) *Attorney, Agent, or Firm* — Wells St. John P.S.

(57) ABSTRACT

Some embodiments include a memory cell having first and second transistors, and a capacitor vertically displaced relative to the first and second transistors. The capacitor has a first node electrically coupled with a source/drain region of the first transistor, a second node electrically coupled with a source/drain region of the second transistor, and capacitor dielectric material between the first and second nodes. Some embodiments include a memory cell having first and second transistors vertically displaced relative to one another, and a capacitor between the first and second transistors. The capacitor has a first node electrically coupled with a source/drain region of the first transistor, a second node electrically (Continued)

coupled with a source/drain region of the second transistor, and capacitor dielectric material between the first and second nodes.

8 Claims, 10 Drawing Sheets

Related U.S. Application Data (60) Provisional application No. 62/381,720, filed on Aug. 31, 2016.

(51) Int. Cl.
　　*H01L 49/02*     (2006.01)
　　*H01L 29/423*    (2006.01)
　　*H01L 29/78*     (2006.01)
　　H01L 23/528    (2006.01)
　　H01L 27/06     (2006.01)
　　H01L 29/08     (2006.01)
　　H01L 29/10     (2006.01)

(52) U.S. Cl.
　　CPC .... *H01L 29/42376* (2013.01); *H01L 29/7827* (2013.01); *H01L 23/528* (2013.01); *H01L 27/0688* (2013.01); *H01L 29/0847* (2013.01); *H01L 29/1037* (2013.01)

(58) Field of Classification Search
　　CPC ............. H01L 29/1037; H01L 29/0847; H01L 23/528; G11C 11/403
　　See application file for complete search history.

(56) References Cited

U.S. PATENT DOCUMENTS

| | | | |
|---|---|---|---|
| 5,066,607 A | 11/1991 | Banerjee | |
| 5,146,300 A | 9/1992 | Hamamoto et al. | |
| 5,299,155 A | 3/1994 | Yanagi | |
| 5,389,810 A | 2/1995 | Agata | |
| 5,398,200 A | 3/1995 | Mazure et al. | |
| 5,571,743 A | 11/1996 | Henkels et al. | |
| 5,586,078 A | 12/1996 | Takase et al. | |
| 5,646,900 A | 7/1997 | Tsukude et al. | |
| 5,830,791 A * | 11/1998 | Lee | H01L 27/10808 |
| | | | 438/238 |
| 5,898,608 A | 4/1999 | Hirano et al. | |
| 6,028,806 A | 2/2000 | Waller | |
| 6,141,286 A | 10/2000 | Vo et al. | |
| 6,154,387 A | 11/2000 | Takata | |
| 6,483,737 B2 | 11/2002 | Takeuchi et al. | |
| 6,563,727 B1 | 5/2003 | Roth et al. | |
| 6,710,465 B2 | 3/2004 | Song et al. | |
| 6,720,609 B2 | 4/2004 | Deboer et al. | |
| 6,744,087 B2 | 6/2004 | Misewich et al. | |
| 6,961,271 B2 | 11/2005 | Jeon et al. | |
| 7,164,595 B1 | 1/2007 | Shore et al. | |
| 7,330,388 B1 | 2/2008 | Chapman et al. | |
| 7,378,702 B2 | 5/2008 | Lee | |
| 7,408,218 B2 | 8/2008 | Akiyama et al. | |
| 7,453,103 B2 | 11/2008 | Abbott et al. | |
| 7,558,097 B2 | 7/2009 | Khellah et al. | |
| 7,697,318 B2 | 4/2010 | Fukuda et al. | |
| 8,018,058 B2 | 9/2011 | Lee | |
| 8,212,311 B2 | 7/2012 | Masuoka et al. | |
| 8,394,699 B2 | 3/2013 | Haller et al. | |
| 8,866,208 B2 | 10/2014 | Lee | |
| 9,184,218 B2 | 11/2015 | Zhang et al. | |
| 9,245,893 B1 | 1/2016 | Sukekawa | |
| 9,343,507 B2 | 5/2016 | Takaki | |
| 9,378,780 B1 | 6/2016 | Chang et al. | |
| 9,419,003 B1 | 8/2016 | Colinge et al. | |
| 9,698,272 B1 | 7/2017 | Ikeda et al. | |
| 10,020,311 B1 | 7/2018 | Li et al. | |
| 10,079,235 B2 | 9/2018 | Mathew et al. | |
| 10,096,603 B2 | 10/2018 | Kim et al. | |
| 10,157,926 B2 | 12/2018 | Yang et al. | |
| 10,319,724 B2 | 6/2019 | Mathew et al. | |
| 10,355,002 B2 | 7/2019 | Sills | |
| 10,381,357 B2 | 8/2019 | Karda et al. | |
| 2001/0053088 A1 | 12/2001 | Forbes | |
| 2002/0044477 A1 | 4/2002 | Takeuchi et al. | |
| 2002/0093865 A1 | 7/2002 | Agata | |
| 2002/0113260 A1* | 8/2002 | Yang | H01L 28/75 |
| | | | 257/310 |
| 2002/0125508 A1 | 9/2002 | Durcan et al. | |
| 2002/0140106 A1 | 10/2002 | Kurjanowicz | |
| 2003/0087499 A1 | 5/2003 | Lane et al. | |
| 2003/0169616 A1 | 9/2003 | Noro | |
| 2003/0173593 A1 | 9/2003 | Miyatake | |
| 2003/0185041 A1 | 10/2003 | Takahashi et al. | |
| 2003/0202391 A1 | 10/2003 | Nishimura et al. | |
| 2003/0234413 A1 | 12/2003 | Sberno et al. | |
| 2004/0062101 A1 | 4/2004 | Kasuga | |
| 2004/0090810 A1 | 5/2004 | Sakuma | |
| 2004/0099886 A1 | 5/2004 | Rhodes et al. | |
| 2004/0151020 A1 | 8/2004 | Beer | |
| 2004/0174733 A1 | 9/2004 | Kirihata et al. | |
| 2004/0232497 A1 | 11/2004 | Akiyama | |
| 2004/0252542 A1 | 12/2004 | Hoya et al. | |
| 2005/0023589 A1 | 2/2005 | Yamada et al. | |
| 2006/0028859 A1 | 2/2006 | Forbes | |
| 2006/0046391 A1* | 3/2006 | Tang | H01L 29/42392 |
| | | | 438/268 |
| 2006/0046424 A1 | 3/2006 | Chance et al. | |
| 2006/0138466 A1 | 6/2006 | Choi | |
| 2006/0164876 A1 | 7/2006 | Barth et al. | |
| 2006/0211194 A1 | 9/2006 | Haller | |
| 2007/0034928 A1 | 2/2007 | Cook et al. | |
| 2007/0161179 A1 | 7/2007 | Lee | |
| 2007/0235790 A1 | 10/2007 | Kim et al. | |
| 2007/0295995 A1 | 12/2007 | Yun | |
| 2008/0079049 A1 | 4/2008 | Lee et al. | |
| 2008/0253170 A1 | 10/2008 | Inaba | |
| 2009/0008691 A1 | 1/2009 | Lee et al. | |
| 2009/0108881 A1 | 4/2009 | Wilson | |
| 2009/0168489 A1 | 7/2009 | Madan et al. | |
| 2009/0212338 A1 | 8/2009 | Benson | |
| 2010/0112753 A1 | 5/2010 | Lee | |
| 2010/0165704 A1 | 7/2010 | Wu et al. | |
| 2010/0238697 A1 | 9/2010 | Juengling | |
| 2010/0264484 A1 | 10/2010 | Masuoka et al. | |
| 2010/0295110 A1 | 11/2010 | Takaishi | |
| 2010/0297820 A1 | 11/2010 | Lee et al. | |
| 2011/0062523 A1 | 3/2011 | Masuoka et al. | |
| 2012/0153371 A1 | 6/2012 | Chen et al. | |
| 2013/0099305 A1* | 4/2013 | Kim | H01L 27/2454 |
| | | | 257/329 |
| 2013/0161607 A1 | 6/2013 | Yoneda | |
| 2013/0214420 A1 | 8/2013 | Shimamoto | |
| 2013/0221356 A1 | 8/2013 | Yamazaki | |
| 2013/0235641 A1 | 9/2013 | Iwaki | |
| 2013/0235642 A1 | 9/2013 | Heineck et al. | |
| 2013/0286734 A1* | 10/2013 | Chang | H01L 27/11565 |
| | | | 365/185.05 |
| 2014/0027839 A1 | 1/2014 | Kim | |
| 2014/0035018 A1 | 2/2014 | Lee | |
| 2014/0054718 A1 | 2/2014 | Karda et al. | |
| 2014/0220749 A1 | 8/2014 | Rutter | |
| 2015/0041885 A1 | 2/2015 | Yoshida et al. | |
| 2015/0078056 A1 | 3/2015 | Liu | |
| 2015/0102282 A1 | 4/2015 | Zhang et al. | |
| 2015/0179655 A1 | 6/2015 | Nakanishi et al. | |
| 2015/0318285 A1 | 11/2015 | Zhang | |
| 2016/0071843 A1 | 3/2016 | Kadoya | |
| 2016/0079247 A1 | 3/2016 | Lim et al. | |
| 2017/0033111 A1 | 2/2017 | Yamazaki et al. | |
| 2017/0053920 A1 | 2/2017 | Kim et al. | |
| 2017/0186782 A1 | 6/2017 | Lee et al. | |
| 2018/0061840 A1 | 3/2018 | Sills | |

(56) References Cited

U.S. PATENT DOCUMENTS

| | | |
|---|---|---|
| 2018/0197864 A1 | 7/2018 | Sills |
| 2019/0019544 A1 | 1/2019 | Derner et al. |

FOREIGN PATENT DOCUMENTS

| | | |
|---|---|---|
| EP | 17847157.9 | 2/2020 |
| EP | 17847158.7 | 2/2020 |
| EP | 17847159 | 2/2020 |
| EP | 17847169 | 2/2020 |
| EP | 17847156 | 3/2020 |
| EP | 17847158 | 5/2020 |
| EP | 18850297 | 7/2020 |
| JP | H 03-205867 | 9/1991 |
| JP | H 08-147983 | 6/1996 |
| JP | H08-264764 | 10/1996 |
| JP | 2003-303901 | 10/2003 |
| JP | 2011-142256 | 7/2011 |
| KR | 10-2006-0126795 | 12/2006 |
| KR | 10-2007-0070021 | 7/2007 |
| TW | 108138429 | 4/2020 |
| WO | WO 2005/093836 | 10/2005 |
| WO | PCT/US2017/044611 | 11/2017 |
| WO | PCT/US2017/044633 | 11/2017 |
| WO | PCT/US2017/044638 | 11/2017 |
| WO | PCT/US2017/044653 | 11/2017 |
| WO | PCT/US2017/044661 | 11/2017 |
| WO | PCT/US2017/045052 | 11/2017 |
| WO | PCT/US2017/068227 | 4/2018 |
| WO | PCT/US2018/041312 | 11/2018 |
| WO | PCT/US2017/044611 | 3/2019 |
| WO | PCT/US2017/044633 | 3/2019 |
| WO | PCT/US2017/044638 | 3/2019 |
| WO | PCT/US2017/044653 | 3/2019 |
| WO | PCT/US2017/044661 | 3/2019 |
| WO | PCT/US2017/045052 | 3/2019 |
| WO | PCT/US2017/068227 | 7/2019 |
| WO | PCT/US2018/041312 | 3/2020 |

OTHER PUBLICATIONS

Henkels et al., "Large-Signal 2T, 1C DRAM Cell: Signal and Layout Analysis", IEEE Journal of Solid-State Circuits, vol. 29(7), Jul. 1994, pp. 829-832.

Hewes, "Circuit Diagrams", available online at https://electronicsclub.info/circuitdiagrams.htm, Dec. 14, 2018, pp. 1-3.

Wei et al., "A New High-Reliable 2T/1C FeRAM Cell", Integrated Ferroelectrics vol. 81, 2006, Switzerland, pp. 149-155.

* cited by examiner

VERTICAL TWO-TRANSISTOR SINGLE CAPACITOR MEMORY CELLS AND MEMORY ARRAYS

RELATED PATENT DATA

This patent resulted from a divisional of U.S. patent application Ser. No. 15/664,161, which was filed Jul. 31, 2017, which is hereby incorporated herein by reference; and which claims priority to U.S. Provisional Patent Application Ser. No. 62/381,720, which was filed Aug. 31, 2016.

TECHNICAL FIELD

Memory cells, such as memory cells having two transistors and one capacitor (i.e., 2T-1C memory cells). Memory arrays comprising 2T-1C memory cells.

BACKGROUND

Dynamic Random Access Memory (DRAM) is utilized in modern computing architectures. DRAM may provide advantages of structural simplicity, low cost and speed in comparison to alternative types of memory.

Figure 1:
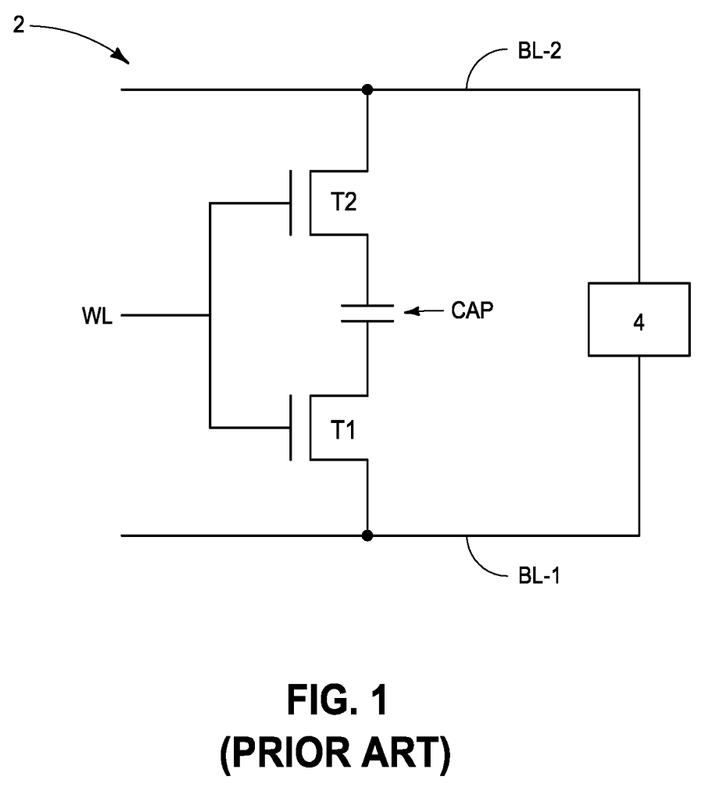
FIG. 1 is a schematic diagram of a prior art memory cell having 2 transistors and 1 capacitor.

Presently, DRAM commonly utilizes memory cells having one capacitor in combination with a transistor (so-called 1T-1C memory cells), with the capacitor being coupled with a source/drain region of the transistor. One of the limitations to scalability of present 1T-1C configurations is that it is proving difficult to incorporate capacitors having sufficiently high capacitance into highly-integrated architectures. Accordingly, it would be desirable to develop new memory cell configurations suitable for incorporation into highly-integrated modern memory architectures. As another DRAM cell, a 2T-1C memory cell configuration is schematically illustrated in FIG. 1 according to the prior art, which includes two transistors and one capacitor.

DETAILED DESCRIPTION OF THE ILLUSTRATED EMBODIMENTS

Some embodiments include 2T-1C configurations in which two or more components are vertically stacked relative to one another in order to increase integration. Specific example embodiments of stacking arrangements are described below with reference to FIGS. 2-13.

Referring again to FIG. 1, an example prior art 2T-1C memory cell configuration 2 includes two transistors and one capacitor. The two transistors are labeled as T1 and T2, and the capacitor is labeled as CAP.

A source/drain region of T1 connects with a first node of the capacitor (CAP), and the other source/drain region of T1 connects with a first comparative bitline (BL-1). A gate of T1 connects with a wordline (WL). A source/drain region of T2 connects with a second node of the capacitor (CAP), and the other source/drain region of T2 connects with a second comparative bitline BL-2. A gate of T2 connects with the wordline (WL).

The comparative bitlines BL-1 and BL-2 extend to circuitry 4 which compares electrical properties (e.g., voltage) of the two to ascertain a memory state of memory cell 2. An advantage of the 2T-1C memory cell is that a memory state may be ascertained by comparing the electrical properties of the two comparative bitlines BL-1 an BL-2 to one another, and accordingly a reference bitline associated with prior art memory (for instance, 1T-1C memory) may be omitted.

The 2T-1C configuration of FIG. 1 may be utilized in DRAM (dynamic random access memory) and/or other types of memory.

Figure 2:
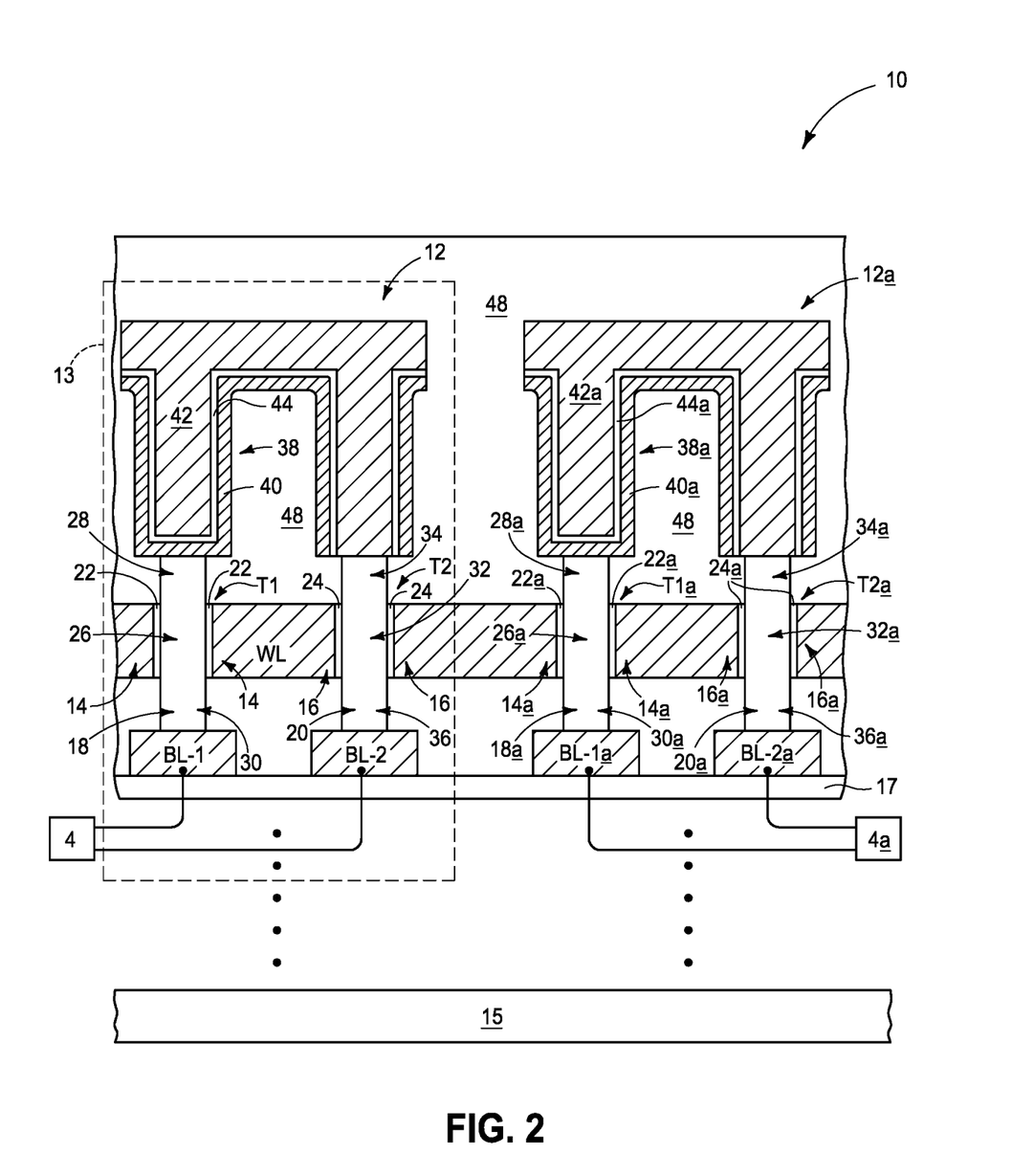
FIG. 2 is a diagrammatic cross-sectional side view of a region of a memory array showing an example configuration for memory cells having 2 transistors and 1 capacitor.

FIG. 2 shows a region of a memory array 10 comprising example 2T-1C memory cells. Specifically, a pair of adjacent memory cells 12 and 12a are illustrated. A dashed line 13 demarcates an approximate boundary of the memory cell 12. The memory cells 12 and 12a are substantially identical to one another, with the term "substantially identical" meaning that the memory cells are identical to within reasonable tolerances of fabrication and measurement.

The illustrated portion of memory array 10 is supported by a base 15. The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc. The base 15 is shown to be spaced from components of array 10 to indicate that other circuitry or components may be between array 10 and the base 15. An interlayer insulating film 17 may intervene between the base 15 and the array 10. Although the film 17 is only shown in FIG. 2, it is to be understood that it may be present in the embodiments shown in other figures as well. The film 17 may comprise any suitable electrically insulative material or combination of insulative materials, including, for example, silicon dioxide, silicon nitride, etc.

In the illustrated embodiment, the insulating film 17 has a substantially planar upper surface, and the comparative bitlines (BL-1, BL-2, BL-1a and BL-2a) are disposed on such upper surface, and in parallel with one another. The term "substantially planar" means planar to within reasonable tolerances of fabrication and measurement.

The memory cell 12 comprises a pair of comparative bitlines BL-1 and BL-2, and comprises transistors T1 and T2 over the bitlines BL-1 and BL-2, respectively. Similarly the memory cell 12a comprises a pair of comparative bitlines BL-1a and BL-2a, and comprises transistors T1a and T2a. The comparative bitlines BL-1 and BL-2 are electrically coupled with circuitry 4 of the type described above with reference to FIG. 1 for comparing electrical properties of the comparative bitlines one another, and similarly the comparative bitlines BL-1a and BL-2a are electrically coupled with circuitry 4a for comparing electrical properties of the comparative bitlines one another. Circuitry 4 and 4a, each serving as a sense amplifier, may be in any suitable location relative to array 10, and may, for example, be between array 10 and base 15, laterally offset from array 10, etc. Circuitry 4 and 4a may be further incorporated into the base 15 as a sense amplifier together with other electrical circuits that may be used to access to the array 10 to read or write data from or into the array 10. In applications in which an interlayer insulating film intervenes between the array 10 and the base 15, a plurality of vias may be formed in the interlayer insulating film to electrically connect wordlines WL and bitlines BL of the array 10 to the circuits, such as the sense amplifiers 4 and 4a, that may be formed in the base 15.

In the illustrated embodiment the comparative bitlines BL-1 and BL-2 of memory cell 12 are laterally displaced relative to one another, and similarly the transistors T1 and T2 are laterally displaced relative to one another. The transistors T1 and T2 are shown to be in a common horizontal plane as one another (i.e., are horizontally aligned with one another), but in other embodiments may be vertically offset relative to one another.

The transistors T1 and T2 comprise gates 14 and 16; and similarly the transistors T1a and T2a comprise gates 14a and 16a. The memory cells 12 and 12a are in a common row as one another within the memory array, and accordingly a wordline (WL) extends across all of the transistors T1, T1a, T2 and T2a, and comprises the gates of such transistors. The wordline and the bitlines may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The wordline and bitlines may comprise the same composition as one another, or may comprise different compositions relative to one another.

Semiconductor pillars 18 and 20 extend upwardly from the comparative bitlines BL-1 and BL-2. Such semiconductor pillars may comprise any suitable semiconductor materials including, for example, one or both of silicon and germanium. Similar semiconductor pillars 18a and 20a extend upwardly from the comparative bitlines BL-1a and BL-2a.

The transistor gate 14 is spaced from the semiconductor pillar 18 by gate dielectric material 22, and the transistor gate 16 is spaced from the semiconductor pillar 20 by gate dielectric material 24. The gate dielectric materials 22 and 24 may comprise any suitable compositions or combinations of compositions; including, for example, silicon dioxide, silicon nitride, high-K dielectric material, ferroelectric material, etc. Analogous gate dielectric materials 22a and 24a are within the transistors T1a and T2a.

The transistor T1 comprises a channel region 26 within semiconductor material of pillar 18, and comprises source/drain regions 28 and 30 on opposing sides of the channel region. The source/drain regions and channel region may be doped with any suitable dopants. In some embodiments the source/drain regions may be n-type majority doped, and in other embodiments may be p-type majority doped.

The transistor T2 comprises a channel region 32 within semiconductor material of pillar 20, and comprises source/drain regions 34 and 36 on opposing sides of the channel region. In some embodiments the source/drain regions 28 and 30 may be referred to as first and second source/drain regions, respectively; and the source/drain regions 34 and 36 may be referred to as third and fourth source/drain regions, respectively.

The transistors T1a and T2a comprise source/drain regions (28a/30a/34a/36a) and channel regions (26a/32a) analogous those described with reference to transistors T1 and T2.

Memory cell 12 comprises a capacitor 38 which is vertically displaced relative to transistors T1 and T2, and in the illustrated embodiment is over the transistors T1 and T2. The capacitor comprises an outer node (or first node) 40, an inner node (or second node) 42, and capacitor dielectric material 44 between the inner and outer nodes. In the shown embodiment the outer node 40 is container-shaped, and the inner node 42 and capacitor dielectric material 44 extend into the container-shaped outer node. In other embodiments the outer node may have a different configuration (e.g., a planar configuration).

The inner and outer nodes 40 and 42 may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. The inner and outer nodes 40 and 42 may comprise the same composition as one another in some embodiments, and in other embodiments may comprise different compositions relative to one another.

The capacitor dielectric material 44 may comprise any suitable composition or combination of compositions. In some embodiments, the capacitor dielectric material may comprise non-ferroelectric material and may, for example, consist of one or more of silicon dioxide, silicon nitride, aluminum oxide, hafnium oxide, zirconium oxide, etc. In some embodiments the capacitor dielectric material may comprise ferroelectric material. For instance, the capacitor dielectric material may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

In the shown embodiment the outer electrode 40 is electrically coupled with the first source/drain region 28 of transistor T1, and the inner electrode 42 is electrically coupled with the third source/drain region 34 of transistor T2. The second source/drain region 30 of transistor T1 is electrically coupled with comparative bitline BL-1 and the fourth source/drain region 36 of transistor T2 is electrically coupled with comparative bitline BL-2. The capacitor 38, together with transistors T1 and T2, and comparative bitlines BL-1 and BL-2, forms a 2T-1C memory cell of the type described above with reference to FIG. 1.

The inner electrode 42 is shown having a single homogenous composition that extends from inside of the container-shaped outer electrode 40 to outside of the container-shaped outer electrode and into electrical contact with source/drain region 34. In other embodiments at least some of the illustrated portion of the inner electrode 42 outside of the container-shaped outer electrode 40 may be replaced with an electrically conductive interconnect which may or may not have a same composition as the inner electrode 42.

The memory cell 12a comprises a capacitor 38a analogous to the capacitor 30 of memory cell 12 (with capacitor 38a comprising a first node 40a, a second node 42a and capacitor dielectric material 44a), and also comprises a 2T-1C memory cell of the type described above with reference to FIG. 1.

Insulative material 48 is shown to surround the various components of memory cells 12 and 12a. Such insulative material may comprise any suitable composition or combination of compositions; including, for example, one or more of silicon dioxide, silicon nitride, borophosphosilicate glass, spin-on dielectric, etc. Although insulative material 48 is shown as a single homogeneous material, in other embodiments the insulative material may include two or more discrete insulative compositions.

Figure 3:
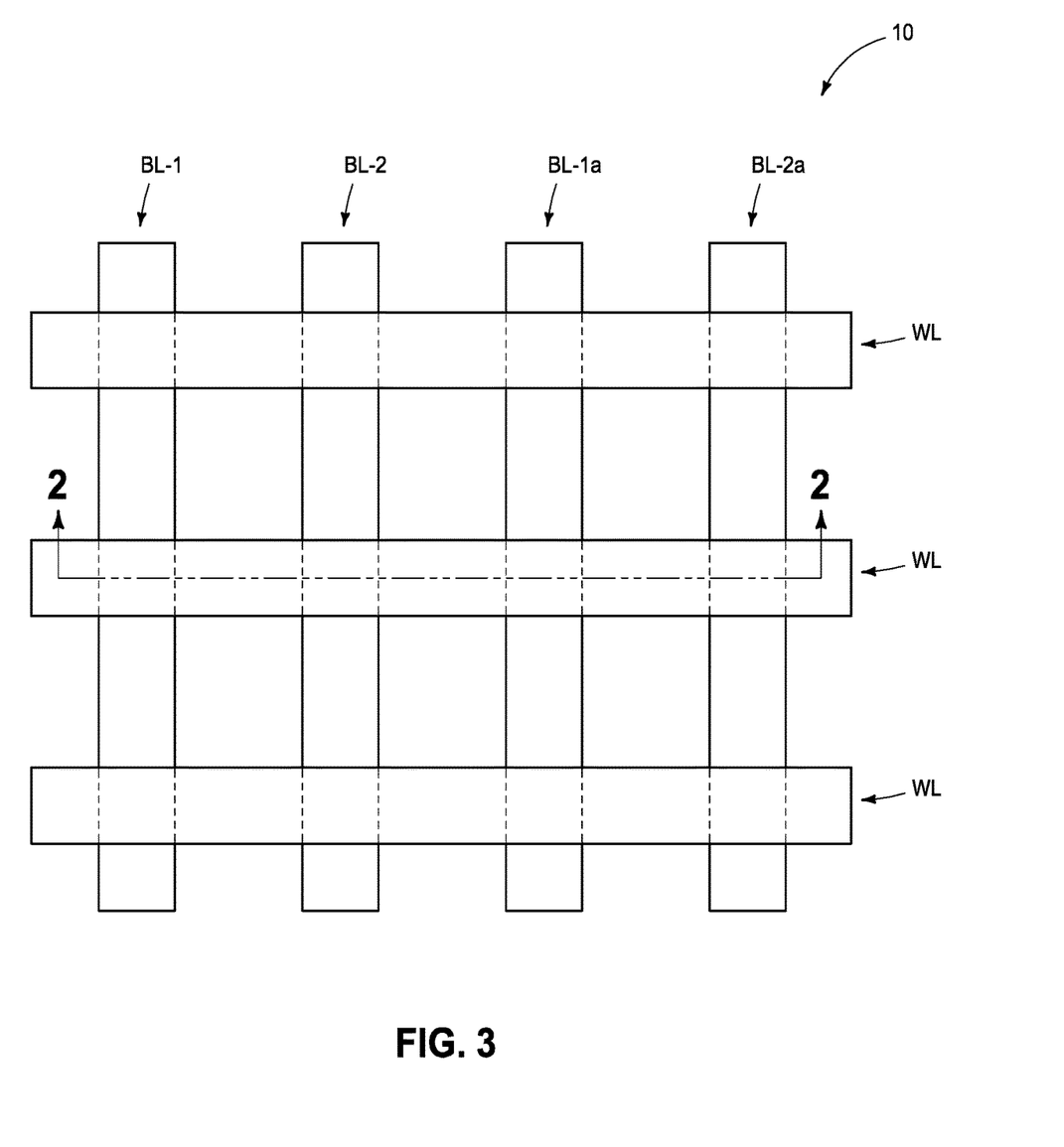
FIG. 3 is a diagrammatic top view of the memory array of FIG. 2.

FIG. 3 is a top view of a region of memory array 10 showing an example embodiment relationship between a series of wordlines (WL) and comparative bitlines (BL-1, BL-2, BL-1a and BL-2a). The cross-section of FIG. 2 is along the line 2-2 of FIG. 3.

Figure 4:
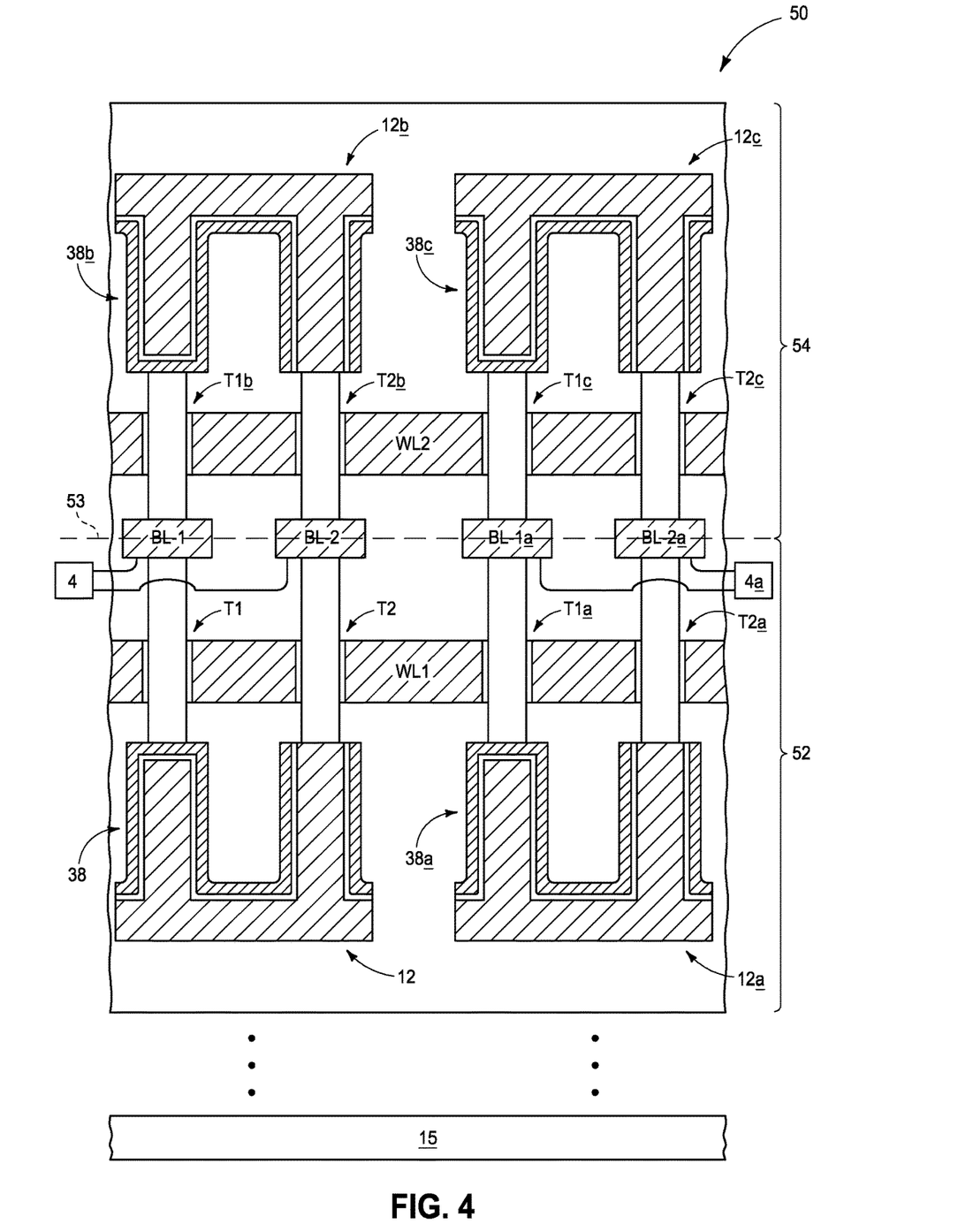
FIG. 4 is a diagrammatic cross-sectional side view of a memory array showing another example configuration for memory cells having 2 transistors and 1 capacitor.

In some embodiments configurations analogous to that of FIGS. 2 and 3 may be incorporated into stacked memory array tiers. In such embodiments a second tier may be over a first tier and inverted such that comparative bitlines may be shared between the tiers. FIG. 4 shows a region of an example arrangement 50 of stacked memory array tiers, with a second tier 54 being over a first tier 52.

The first tier 52 comprises memory cells 12 and 12a of the type described in FIGS. 2 and 3. The second tier 54 comprises similar memory cells 12b and 12c, except that the second memory cells are inverted relative to the first memory cells. The memory cell 12b comprises first and second transistors T1b and T2b, and the memory cell 12c comprises first and second transistors T1c and T2c. The memory cells 12b and 12c comprise capacitors 38b and 38c, respectively. The wordline extending across the memory cells 12 and 12a is labeled as a first wordline (WL1), and the wordline across the memory cells 12b and 12c is labeled as a second wordline (WL2).

In some embodiments an axis 53 through the comparative bitlines BL-1, BL-2, BL-1a and BL-2a may be considered to define a mirror plane and the memory cells 12b and 12c may be considered to be substantially mirror images of the memory cells 12 and 12a, respectively, across the mirror plane. The term "substantially mirror images" is utilized to indicate that the indicated cells may be mirror images of one another to within reasonable tolerances of fabrication and measurement.

In some embodiments the configuration of FIGS. 2 and 3 may be considered to comprise memory cells within $4F^2$ architecture, and the configuration of FIG. 4 may be considered to comprise memory cells within $8F^2$ architecture.

The embodiment of FIG. 2 shows comparative bitlines BL-1 and BL-2 within a common horizontal plane as one another (i.e., are horizontally aligned with one another). In other embodiments, the comparative bitlines BL-1 and BL-2 may be vertically displaced relative to one another, as described with reference to FIGS. 5-7.

Figure 5:
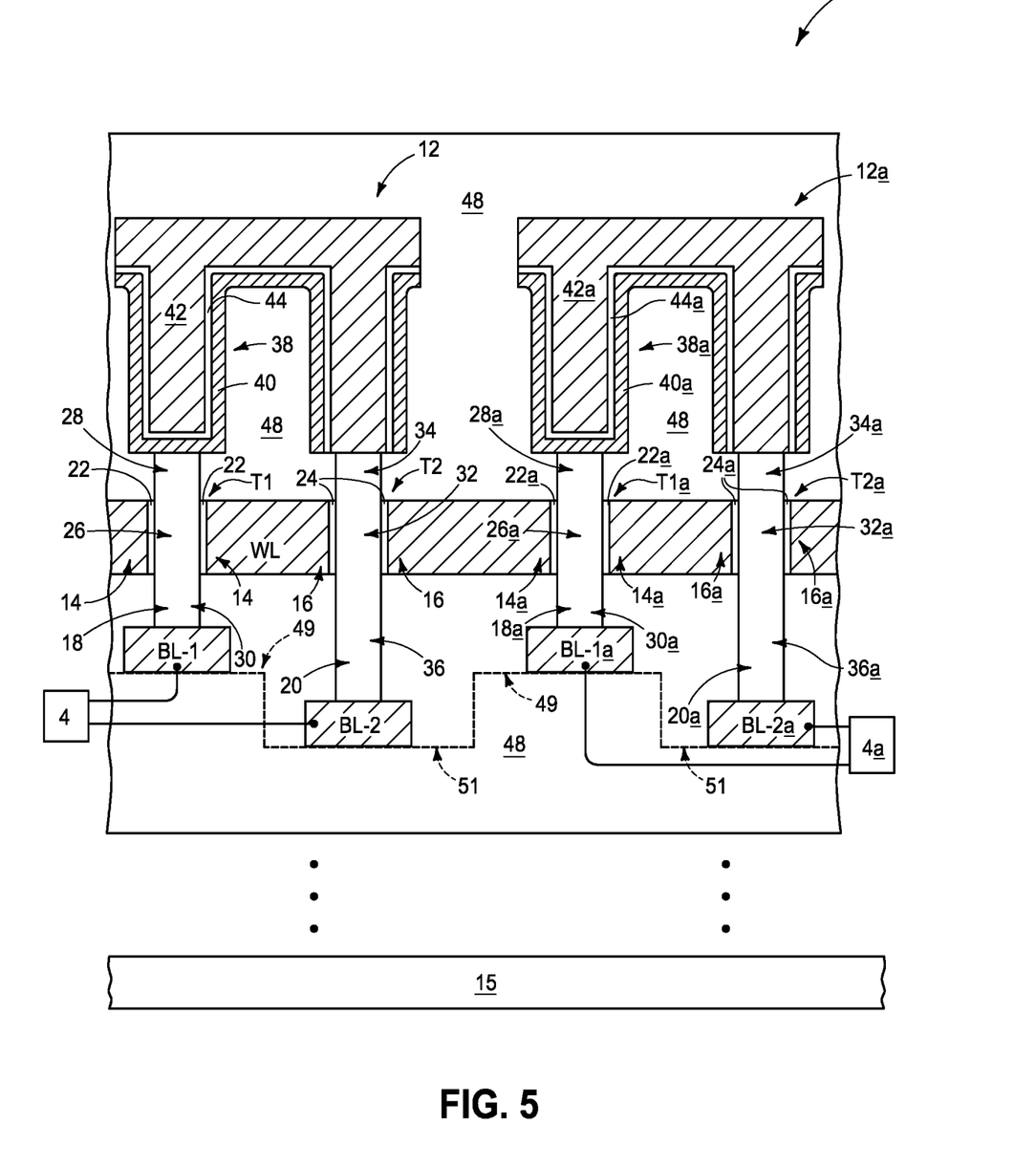
FIG. 5 is a diagrammatic cross-sectional side view of a region of a memory array showing another example configuration for memory cells having 2 transistors and 1 capacitor.

Referring to FIG. 5, a memory array 100 comprises adjacent memory cells 12 and 12a. The memory cells 12 and 12a of memory array 100 are similar to the memory cells 12 and 12a of the memory array 10 discussed above with reference to FIG. 2, except that the second comparative bitlines BL-2/BL-2a are vertically displaced relative to the first comparative bitlines BL-1/BL-1a in the configuration of FIG. 5. In contrast, the first and second comparative bitlines are not vertically displaced relative to one another in the configuration of FIG. 2.

The configuration of FIG. 5 may be formed with any suitable method. In some embodiments the configuration of FIG. 5 may be formed by including insulative subcomponents of material 48 having first surfaces 49 and second surfaces 51, with first surfaces 49 being above second surfaces 51. Such subcomponents of material 48 may correspond to one or more insulative films in some embodiments.

In the illustrated embodiment of FIG. 5, the second comparative bitlines BL-2/BL-2a are deeper than the first comparative bitlines BL-1/BL-1a, and accordingly pedestals 20/20a are longer than pedestals 18/18a within memory cells 12/12a. In such embodiment, the distance between second comparative bitlines BL-2/BL-2a and the channel regions 32/32a of transistors T2/T2a is lengthened relative to the embodiment of FIG. 2, resulting in the lengthening of the source/drain regions 36/36a of transistors T2/T2a. In some embodiments electrically conductive interconnects (not shown) may be provided along upper surfaces of BL-2/BL-2a to reduce the length of the source/drain regions 36/36a.

Figure 6:
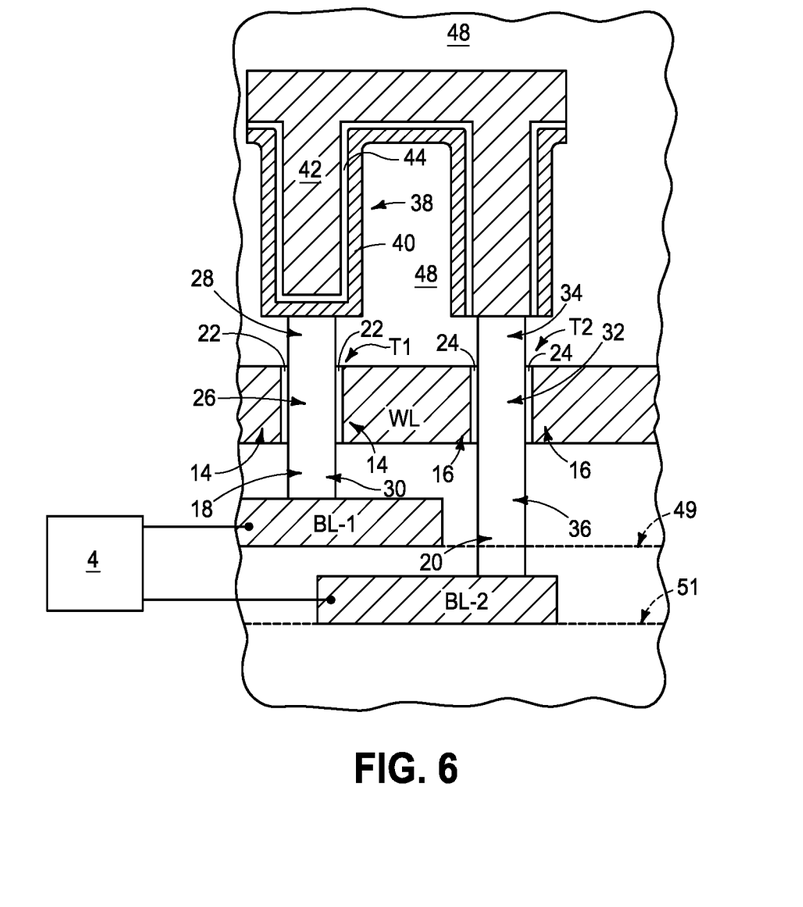
FIG. 6 is a cross-sectional side view of a region another example configuration for a memory cell having 2 transistors and 1 capacitor.

The first comparative bitlines BL-1/BL-1a are entirely laterally displaced relative to the second comparative bitlines BL-2/BL-2a for each of the memory cells 12/12a in the embodiment of FIG. 5. FIG. 6 shows an alternative embodiment in which the comparative bitlines BL-1 and BL-2 laterally overlap one another. In the illustrated embodiment of FIG. 6, the pedestal 20 is laterally offset from a center of comparative bitline BL-2. In other embodiments the pedestal 20 may extend to the central region of BL-2 even though the comparative bitlines BL-1 and BL-2 laterally overlap. In yet other embodiments the pedestal 18 may be laterally offset from a center of comparative bitline BL-1 in addition to, or alternatively to, the pedestal 20 being offset from the center of comparative bitline BL-2. The lateral overlap of the comparative bitlines BL-1 and BL-2 in the embodiment of FIG. 6 may provide larger landing pads for the pedestals 18 and 20 which may better compensate for mask misalignment as compared to embodiments having smaller dimensions of the comparative bitlines. Example surfaces 49 and 51 are diagrammatically illustrated in FIG. 6 to illustrate an example method of forming the construction of FIG. 6 through utilization of subcomponents of insulative material 48 having upper surfaces 49 and 51.

Figure 7:
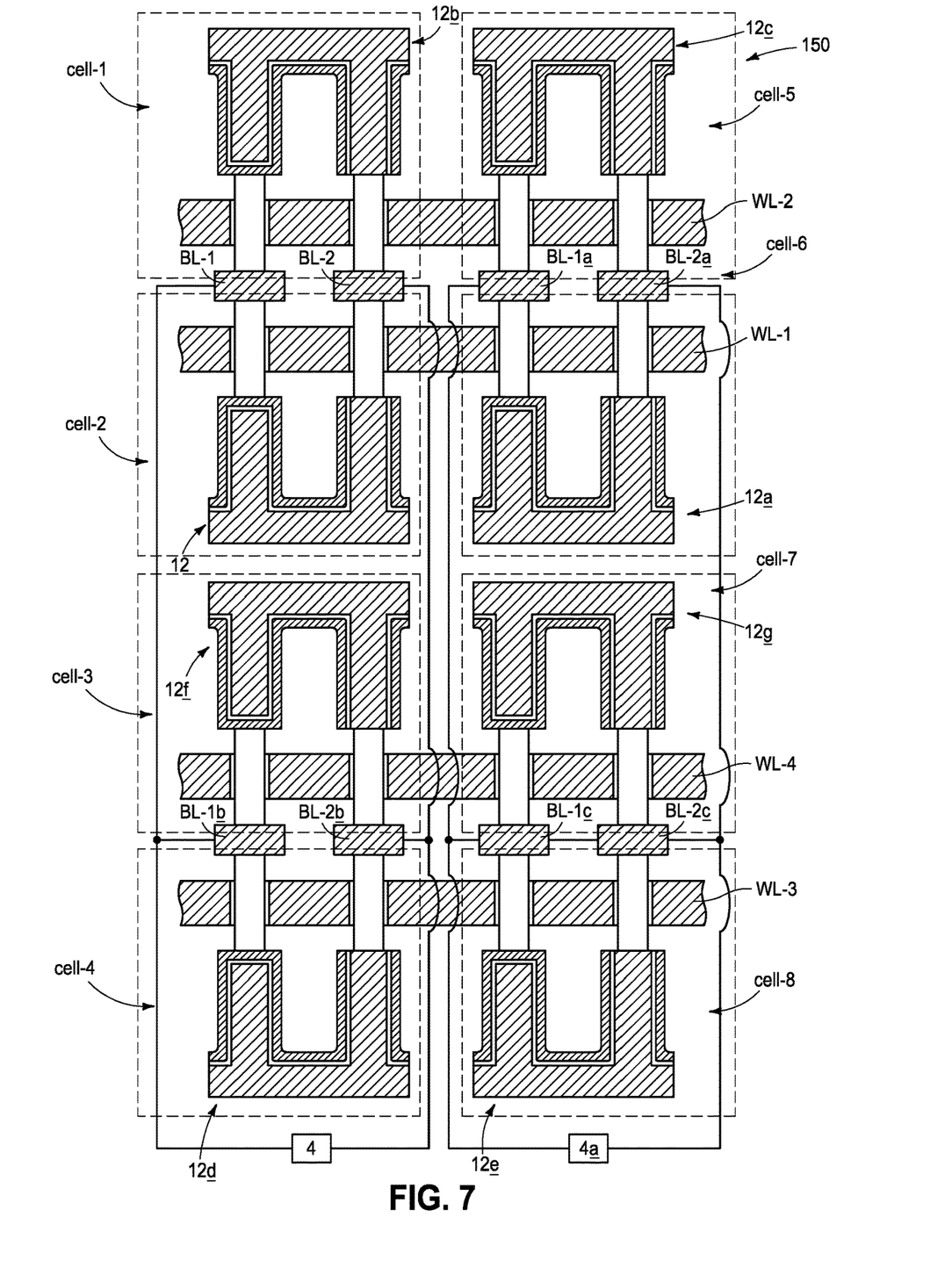
FIG. 7 is a diagrammatic cross-sectional side view of a region of another memory array showing another example configuration for memory cells having 2 transistors and 1 capacitor.

FIG. 7 shows a region of an example embodiment memory array 150 with stacked memory cells. Specifically, the array 150 comprises memory cells 12 and 12a-g; with memory cells 12b, 12, 12f and 12d (i.e., cell-1, cell-2, cell-3 and cell-4) being in a first vertical stack, and memory cells 12c, 12a, 12g and 12e (i.e., cell-5, cell-6, cell-7 and cell-8) being in a second vertical stack. The memory cells of the first vertical stack are electrically coupled with a first set of comparative bitlines (i.e., comparative bitlines BL-1, BL-2, BL-1b and BL-2b); and the memory cells of the second vertical stack are electrically coupled with a second set of comparative bitlines (i.e., comparative bitlines BL-1a, BL-2a, BL-1c and BL-2c). First sensing amplifier circuitry 4 is electrically coupled with the first set of comparative bitlines, and second sensing amplifier circuitry 4a is electrically coupled with the second set of comparative bitlines.

Wordlines WL-1, WL-2, WL-3 and WL-4 extend along rows of the memory array 150.

Figure 8:
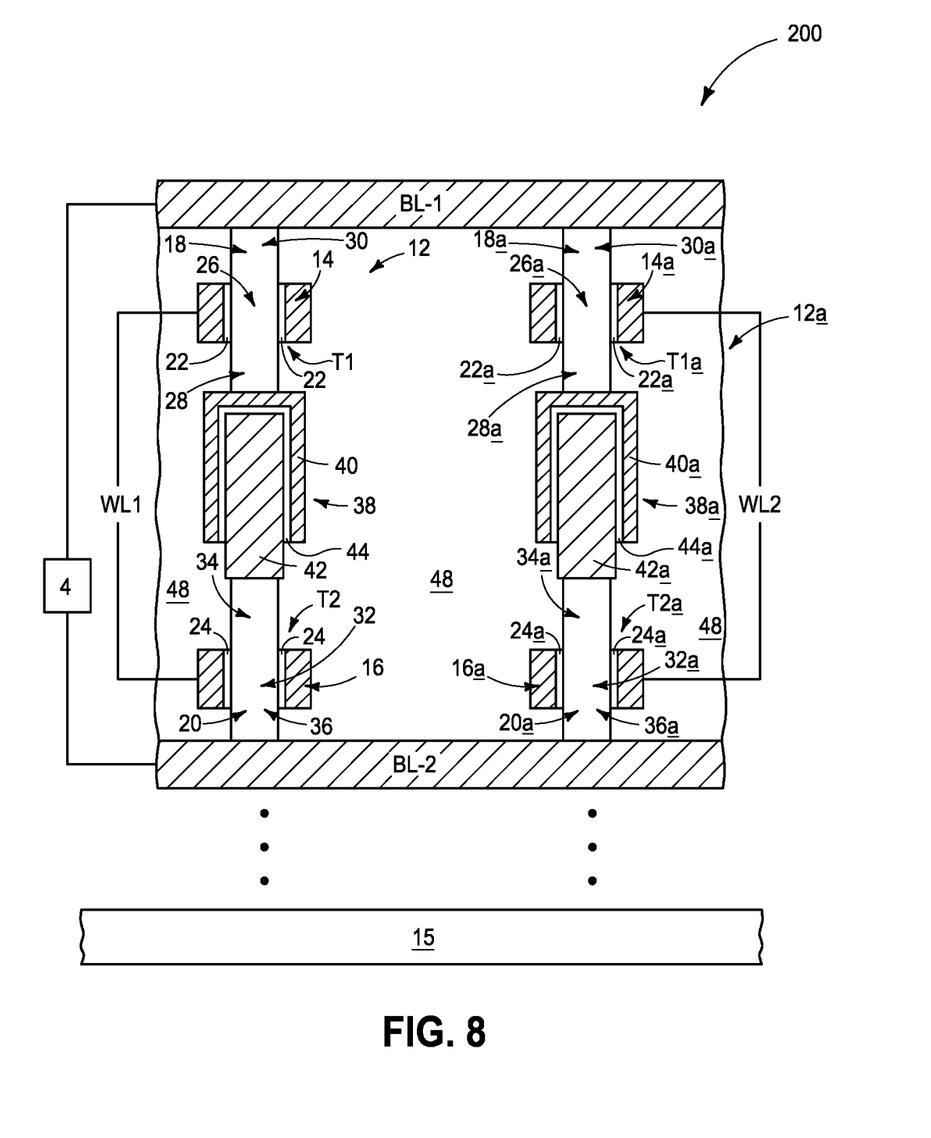
FIG. 8 is a diagrammatic cross-sectional side view of a memory array showing another example configuration for memory cells having 2 transistors and 1 capacitor.

The embodiments of FIGS. 2-7 have the transistors (e.g., T1 and T2) laterally offset from one another, and the capacitor (e.g., 38 of FIG. 2) provided above (or below) both of such transistors. In other embodiments, the two transistors of a 2T-1C memory cell may be vertically offset relative to one another, and the capacitor may be provided vertically between such transistors. FIG. 8 shows a portion of a memory array 200 illustrating an example embodiment in which the capacitors of 2T-1C memory cells are provided between vertically displaced transistors.

The illustrated region of memory array 200 comprises comparative bitlines BL-1 and BL-2, with such comparative bitlines being vertically offset relative to another and connected to circuitry 4. A pair of adjacent memory cells 12 and 12a are shown, with such adjacent memory cells being in a common column as one another within the memory array (i.e., being along a common bitline, with such bitline being comprised by the comparative bitlines BL-1 and BL-2 in combination). Such is in contrast to the embodiments of FIGS. 2, 4 and 5 in which the adjacent memory cells 12 and 12a are in a common row as one another (i.e., are along a common wordline). In some embodiments the memory cells 12 and 12a may be referred to as substantially identical memory cells along a column of a memory array, with the term "substantially identical" meaning that the memory cells are identical to one another within reasonable tolerances of fabrication and measurement.

The lower comparative bitline (BL-2) is shown to be over and supported by a base 15. Such base may be a semiconductor substrate of the type described above with reference to FIG. 2.

The memory cell 12 comprises transistors T1 and T2, with such transistors being along a first wordline WL1. The adjacent memory cell 12a comprises transistors T1a and T2a, with such transistors being along a second wordline WL2.

A capacitor 38 is vertically between the transistors T1 and T2 of memory cell 12, and a similar capacitor 38a is vertically between the transistors T1a and T2a of memory cell 12a.

The capacitors comprise first nodes 40/40a, second nodes 42/42a and capacitor dielectric material 44/44a. Although the first nodes 40/40a are shown to be container-shaped and the second nodes 42/42a are shown to extend within such container shapes, in other embodiments the first and second nodes may have other configurations. For instance, the first and second nodes may have planar configurations. In the illustrated configuration the first nodes 40/40a may be referred to as outer nodes and the second nodes 42/42a may be referred to as inner nodes.

The pillars 18/18a extend from comparative bitline BL-1 to the outer nodes 40/40a of capacitors 38/38a, and the pillars 20/20a extend from the comparative bitline BL-2 to the inner nodes 42/42a of capacitors 38/38a.

The transistors T1/T1a have first source/drain regions 28/28a extending to the outer nodes 40/40a of capacitors 38/38a, and have second source/drain regions 30/30a extending to the comparative bitline BL-1. The transistors T1/T1a also have channel regions 26/26a between the first and second source/drain regions. Gates 14/14a are along the channel regions and offset from the channel regions by gate dielectric materials 22/22a.

The transistors T2/T2a have third source/drain regions 34/34a extending to the inner nodes 42/42a of capacitors 38/38a, and have fourth source/drain regions 36/36a extending to the comparative bitline BL-2. The transistors T2/T2a also have channel regions 32/32a between the third and fourth source/drain regions. Gates 16/16a are along the channel regions and offset from the channel regions by gate dielectric materials 24/24a.

The embodiment of FIG. 8 advantageously enables the transistors and capacitor of a 2T-1C memory cell to all be vertically stacked, which may enable the memory cells to be packed to high levels of integration.

Figure 8A:
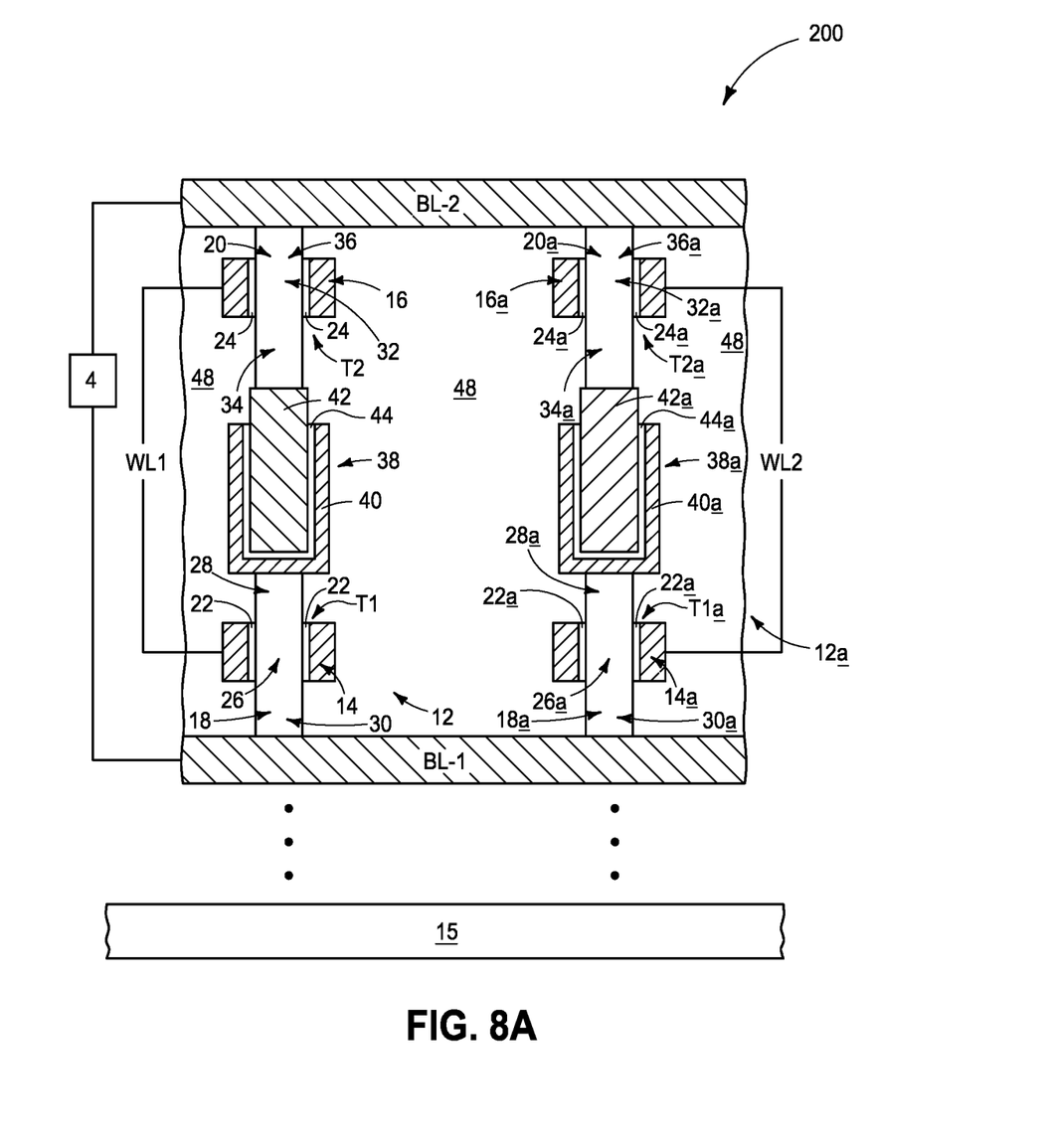
FIG. 8A is a diagrammatic cross-sectional side view of a memory array having an alternative configuration of the example embodiment depicted in FIG. 8.

Although the illustrated embodiment of FIG. 8 comprises a configuration with BL-2 over a supporting substrate 15 and BL-1 over BL-2, in other embodiments the relative orientations of BL-2 and BL-1 could be reversed so that BL-1 is over the supporting substrate and BL-2 is over BL-1. In such other embodiments the illustrated capacitors 38/38a would be inverted relative to the configuration depicted in FIG. 8 and accordingly container-shaped outer nodes 40 would open upwardly instead of downwardly as illustrated in FIG. 8A.

An advantage of various embodiments of memory arrays described above with reference to FIGS. 2-8 is that such embodiments may have symmetric layouts relative to the comparative bitlines (e.g., BL-1 and BL-2) extending throughout the memory arrays, and such may reduce resistance/signal mismatches between the comparative bitlines as compared to less symmetric layouts.

The illustrated capacitors in the above-described embodiments may be replaced with other capacitive units in other embodiments. For instance, any of the capacitors may be replaced with a capacitive unit having two or more capacitors in combination.

The transistors T1 and T2 of the above-described embodiments of FIGS. 2-8 may comprise any suitable configurations. For instance, in the illustrated embodiment the transistors are field effect transistors, but in other embodiments other suitable transistors may be substituted for one or more of the transistors T1 and T2; with bipolar junction transistors being an example of a transistor configuration which may be used alternatively to field effect transistors. The field effect transistors described herein may utilize gate dielectric material comprising non-ferroelectric material and/or ferroelectric material depending on the application. The gates of the transistors may have any of numerous configurations, with some example configurations being described with reference to FIGS. 9-13. The figures specifically pertain to the T1 transistor gates, but in other embodiments analogous configurations may be utilized for the T2 transistor gates.

Figure 9:
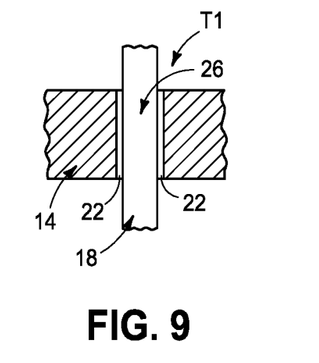
FIGS. 9-13 are expanded regions of one of the transistors of a 2T-1C memory cell showing example embodiment configurations of such transistor.
Figure 10:
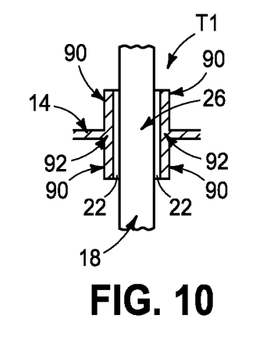
Figure 11:
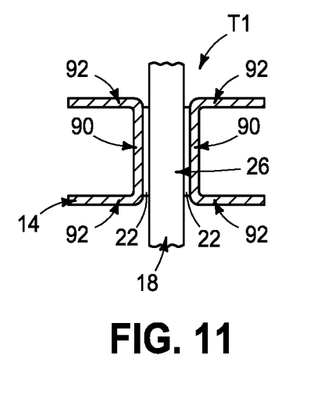
Figure 12:
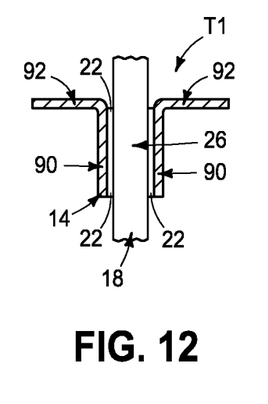
Figure 13:
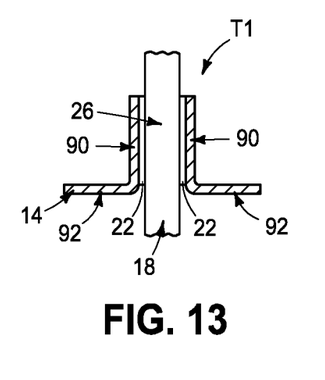

Referring to FIG. 9, the T1 transistor gate 14 is shown in a configuration of the type utilized in the embodiments of FIGS. 2 and 4-8. Specifically, the transistor gate is a block of uniform width, with such width being approximately equal to a length "L" of the channel region 26. In contrast, each of the embodiments of FIGS. 10-13 has the gate narrower than the length of the channel region, and has at least one extension region 90 that extends from the gate and along the channel region. Further, each of the embodiments of FIGS. 10-13 has at least one bent region 92 where the gate 14 joins to an extension region. The embodiment of FIG. 10 shows the gate 14 and extension regions 90 forming a substantially T-shaped configuration, the embodiment of FIG. 11 shows the extension region 90 and gate 14 together forming a substantially U-shaped configuration, and the embodiments of FIGS. 12 and 13 show the gate 14 and extension regions 90 forming substantially shelf-shaped configurations (with FIG. 13 showing the gate 14 as a top shelf over extension regions 90 and FIG. 12 showing the gate 14 as a bottom shelf beneath regions 90).

Advantages of the embodiments of FIGS. 10-13 relative to that of FIG. 9 may include reduced gate resistance and associated reduced current requirements for desired access drive parameters.

The structures and architectures described above may be incorporated into memory (e.g., DRAM, SRAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell having first and second transistors, and a capacitor vertically displaced relative to the first and second transistors. The capacitor has a first node electrically coupled with a source/drain region of the first transistor, a second node electrically coupled with a source/drain region of the second transistor, and capacitor dielectric material between the first and second nodes.

Some embodiments include a memory cell having first and second transistors laterally displaced relative to one another, and a capacitor over the first and second transistors. The capacitor has an outer node electrically coupled with a source/drain region of the first transistor, an inner node electrically coupled with a source/drain region of the second transistor, and capacitor dielectric material between the inner and outer nodes.

Some embodiments include a memory cell having first and second transistors vertically displaced relative to one another, and a capacitor between the first and second transistors. The capacitor has a first node electrically coupled with a source/drain region of the first transistor, a second node electrically coupled with a source/drain region of the second transistor, and capacitor dielectric material between the first and second nodes.

Some embodiments includes an apparatus comprising a semiconductor base, a memory array including a plurality of memory cells, and an insulating film intervening between the semiconductor base and the plurality of memory cells. Each of the memory cells comprises a first transistor, a second transistor and a capacitor, and each of the first transistor, the second transistor and the capacitor is over the insulating film covering the semiconductor base.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a first transistor having a first channel region within a first vertically extending semiconductor pillar and comprising gate material extending vertically along the second channel region on at least two opposing sides of the first vertically extending semiconductor pillar;
    a second transistor having a second channel region within a second vertically extending semiconductor pillar and comprising gate material extending vertically along the second channel region on at least two opposing sides of the second vertically extending semiconductor pillar, the first and second transistors being supported by a semiconductor substrate;
    a capacitor having a first node electrically coupled with a source/drain region of the first transistor, the first node having vertical sidewall surfaces, having a second node electrically coupled with a source/drain region of the second transistor, the second node extending along a portion of the vertical sidewall surfaces of the first node where the first portion is less than an entirety, and having capacitor dielectric material between the first and second nodes;
    wherein the first and second transistors are not in a common horizontal plane as one another; and
    wherein the capacitor is vertically between the first and second transistors, the first vertically extending semiconductor pillar being in direct physical contact with a first comparative bitline and extending from the first comparative bitline to the first node and the second vertically extending semiconductor pillar being in direct physical contact with a second comparative bitline and extending from the second comparative bitline to the second node.

2. A memory cell comprising:
first and second transistors vertically displaced relative to one another, each of the first and second transistors comprising a vertically extending channel region within a semiconductor pillar and having gate material extending vertically along the channel region on at least two opposing sides of the semiconductor pillar, the semiconductor pillar extending vertically above and vertically below the gate material; and
a capacitor disposed to be vertically between the first and second transistors, the capacitor having an inner node electrically coupled and in direct physical contact with a source/drain region of the first transistor, the inner node having vertical sidewall surfaces, the capacitor having an outer node electrically coupled and in direct physical contact with a source/drain region of the second transistor, the outer node surrounding the vertical sidewalls and covering less than an entirety of a vertical height of the vertical sidewalls, the capacitor further comprising capacitor dielectric material between the inner and outer nodes, the semiconductor pillar of the first transistor being in direct physical contact with and extending from a first comparative bitline to the first node and the semiconductor pillar of the second transistor extending from the second node to and in direct physical contact with a second comparative bitline.

3. The memory cell of claim 2 wherein the outer node is container-shaped and the inner node extends into the outer node, and wherein the first transistor is above the second transistor which in turn is above a semiconductor base.

4. The memory cell of claim 2 wherein the outer node is container-shaped and the inner node extends into the outer node, and wherein the second transistor is above the first transistor which in turn is above a semiconductor base.

5. The memory cell of claim 2 wherein:
the first transistor has a first source/drain region and a second source/drain region, and the outer node is electrically coupled with the first source/drain region;
the second transistor has a third source/drain region and a fourth source/drain region, and the inner second node is electrically coupled with the third source/drain region; and
the second and fourth source/drain regions are electrically coupled with first and second comparative bitlines, respectively.

6. The memory cell of claim 5 wherein the first comparative bitline is above the first transistor and the second comparative bitline is below the second transistor.

7. The memory cell of claim 6 being in a memory array; the first and second comparative bitlines being along a column of said memory array; the memory cell being one of a plurality of substantially identical memory cells between the first and second comparative bitlines along said column.

8. An apparatus comprising:
a semiconductor base;
an insulating film over the semiconductor base;
a memory array supported by the insulating film, and including a plurality of memory cells; each of the memory cells comprising:
a first transistor, a second transistor and a capacitor, with the capacitor being vertically disposed between the first transistor and the second transistor; the capacitor having a first node coupled with a source/drain region of the first transistor and having a second node coupled with a source/drain region of the second transistor, the first node comprising vertical sidewalls, the second node extending along a portion of the vertical sidewalls, the portion being less than an entirety of the vertical sidewalls;
a plurality of pairs of bitlines;
a plurality of wordlines, each of the memory cells being coupled to an associated one individual of the plurality of pairs of bitlines and an associated one individual of the plurality of wordlines, an example one of the memory cells being coupled to an associated one of the plurality of pairs of bitlines and an associated one of the plurality of wordlines, the first and second transistors and the capacitor of the example one of the memory cells being coupled in series between the bitlines of the associated one of the plurality of pairs of bitlines;
wherein each of the memory cells comprises a first semiconductor post and a second semiconductor post; the first semiconductor post extending vertically through the first transistor to directly physically contact a first bitline and including the source/drain regions and a channel region of the first transistor, and the second semiconductor post extending vertically through the second transistor to directly physically contact a second bitline and including the source/drain regions and a channel region of the second transistor;
gate material extending vertically along the channel region on at least two opposing sides of each of the first and second semiconductor posts; and
wherein the first and second semiconductor posts are vertically aligned with each other between the first and second bitlines.

* * * * *